(12) United States Patent
Grewing

(10) Patent No.: US 10,340,937 B2
(45) Date of Patent: Jul. 2, 2019

(54) VOLTAGE AMPLIFIER FOR A PROGRAMMABLE VOLTAGE RANGE

(71) Applicant: Forschungszentrum Jülich GmbH, Jülich (DE)

(72) Inventor: Christian Grewing, Jülich (DE)

(73) Assignee: FORSCHUNGSZENTRUM JÜLICH GmbH (DE)

(*) Notice: Subject to any disclaimer, the term of this patent is extended or adjusted under 35 U.S.C. 154(b) by 32 days.

(21) Appl. No.: 15/742,983

(22) PCT Filed: Jul. 5, 2016

(86) PCT No.: PCT/EP2016/065845
§ 371 (c)(1),
(2) Date: Jan. 9, 2018

(87) PCT Pub. No.: WO2017/005743
PCT Pub. Date: Jan. 12, 2017

(65) Prior Publication Data
US 2018/0351567 A1   Dec. 6, 2018

(30) Foreign Application Priority Data
Jul. 9, 2015   (DE) .................. 10 2015 212 842

(51) Int. Cl.
*H03F 3/45* (2006.01)
*H03M 1/12* (2006.01)
*H03M 1/18* (2006.01)

(52) U.S. Cl.
CPC ........ *H03M 1/188* (2013.01); *H03F 3/45183* (2013.01); *H03F 3/45475* (2013.01);
(Continued)

(58) Field of Classification Search
CPC ................ H03M 1/188; H03M 1/1295; H03F 3/45475; H03F 3/45183; H03F 2203/45696
(Continued)

(56) References Cited

U.S. PATENT DOCUMENTS

| 5,231,360 A | * | 7/1993 | Storey ................ H03G 3/001 330/282 |
| 5,990,817 A | | 11/1999 | Belin et al. |

(Continued)

FOREIGN PATENT DOCUMENTS

| DE | 102005020319 A1 | 11/2006 |
| EP | 1111794 A2 | 6/2001 |
| WO | 2004051858 A2 | 6/2004 |

OTHER PUBLICATIONS

International Search Report and Written Opinion for corresponding International Application No. PCT/EP2016/065845, dated Sep. 30, 2016.

(Continued)

*Primary Examiner* — Brian K Young
(74) *Attorney, Agent, or Firm* — Tarolli, Sundheim, Covell & Tummino LLP

(57) ABSTRACT

The invention relates to a voltage amplifier (100, 300) that places defined ranges (12, 14) of an input voltage signal (10) in different relations in terms of the input voltage signal (10) at one or more operating points of an amplifier circuit (130). An appropriate division of the ranges (12, 14) of the input voltage signal (10) makes it possible to linearly amplify the appertaining ranges (12, 14). Such linearly amplified output signals (191, 192, 193, 194) can then be converted into digital signals (531), for example, by means of several analog-to-digital converters (510).

14 Claims, 8 Drawing Sheets

(52) U.S. Cl.
CPC . *H03M 1/1295* (2013.01); *H03F 2203/45674* (2013.01); *H03F 2203/45696* (2013.01)

(58) Field of Classification Search
USPC ........................................................ 341/155
See application file for complete search history.

(56) References Cited

U.S. PATENT DOCUMENTS

| | | | | |
|---|---|---|---|---|
| 6,011,422 | A * | 1/2000 | Koglin | G01D 3/021 |
| | | | | 327/357 |
| 7,190,291 | B2 * | 3/2007 | Markowski | H02M 1/082 |
| | | | | 341/122 |
| 8,193,962 | B1 | 6/2012 | Terwilliger | |
| 2012/0112946 | A1 | 5/2012 | Lovitt | |
| 2014/0232577 | A1 | 8/2014 | Noguchi | |

OTHER PUBLICATIONS

Communication for corresponding German patent application 102015212842.3, dated May 12, 2016.
International Preliminary Report on Patentability for corresponding International Application No. PCT/EP2016/065845 dated Jun. 16, 2017, and English translation.

* cited by examiner

VOLTAGE AMPLIFIER FOR A PROGRAMMABLE VOLTAGE RANGE

RELATED APPLICATIONS

The present invention is a U.S. National Stage under 35 USC 371 patent application, claiming priority to Serial No. PCT/EP2016/065845, filed on 5 Jul. 2016; which claims priority of DE 10 2015 212 842.3, filed on 9 Jul. 2015, the entirety of both of which are incorporated herein by reference.

FIELD OF THE INVENTION

The invention relates to a voltage amplifier for a programmable voltage range and to an associated method for amplifying the voltage for a programmable voltage range.

BACKGROUND OF THE INVENTION

The amplification of the input signal is limited by the maximum supply voltage. The input signal can only be amplified to the extent that it can still be linearly amplified. In pipeline analog-to-digital converters (ADCs), this problem is solved by a feedback of the signal. The signal is subsequently evaluated by one or more comparators and this value is subtracted from the input signal of the comparators so that then only the difference, the so-called residual error, is amplified. Pipeline ADCs have to be laboriously calibrated in order to prevent uncontrolled changes in the residual error due to a shift of the operating point. Therefore, pipeline ADCs cannot be switched on and off suddenly since this can lead to a shift of the operating points.

U.S. Pat. Appln. No. 2014/0232577 A1 discloses an analog-to-digital converter comprising a first and a second analog-to-digital conversion cell as well as a control unit. The control unit is configured to generate a control signal that generates a first and a second input range with respect to the same voltage range as well as a first and a second timing element at different phases when a signal that specifies a mode displays a first mode. The control unit is also configured to generate another control signal that generates the first and the second input range with respect to a continuous voltage range as well as a first and second timing element at the same phase when a signal that specifies a mode displays a second mode.

International patent application WO 2004/051858 A2 discloses a method, an apparatus and a system for converting an input voltage into a digital output signal. A comparison to a reference voltage in one or more (flash-type) analog-to-digital converters generates the digital output signal representing the input voltage. If more than one analog-to-digital converter is used, the analog-to-digital converters are linear.

SUMMARY OF THE INVENTION

It is the objective of the present invention to put forward a voltage amplifier for a programmable voltage range.

According to a first aspect of the invention, a voltage amplifier for a programmable voltage range is put forward. The voltage amplifier has at least a first and a second operating point relative to an input voltage signal. The voltage amplifier is configured to linearly transform a first range of the input voltage signal into a first output signal by means of the first operating point. The voltage amplifier is also configured to linearly transform a second range of the input voltage signal into a second output signal by means of the second operating point. In this context, the operating points of the voltage amplifier should always be seen in relation to the input voltage signal. Different ranges of the input voltage signal are shifted, for example, in such a way that an amplifier that can linearly amplify input voltages between −5V and +5V can also linearly amplify those ranges of the input voltage signal that fall outside of this voltage range. These ranges are shifted in a defined manner into the range that can be linearly amplified. For this purpose, the voltage amplifier could have, for instance, a variable operating point so that, aside from the first and second operating points, additional operating points can be set relative to the input voltage signal. The voltage input signal could be shifted continuously or discretely, for example, by means of variable resistances or reference potentials. In this manner, various ranges of periodic signals could be successively amplified linearly.

In an alternative embodiment, the voltage amplifier could be configured to provide the first and second operating points simultaneously. Therefore, especially in the case of non-periodic signals, it would possible to linearly amplify a markedly fluctuating signal that fluctuates, for example, between −10V and +10V, employing, for instance, two amplifiers, whereby the amplifiers only amplify linearly at an input voltage between −5V and +5V. Here, a first range of this input voltage signal, which is between −10V and 0V, is shifted into the range of the one amplifier in which it amplifies linearly. Here, a second range of this input voltage signal, which is between 0V and 10V, is shifted into the range of the other amplifier in which it amplifies linearly. In this context, the first and second operating points are preferably set in such a way that the first range of the input voltage signal and the second range of the input voltage signal have at least one shared value. In this context, it is preferable for the first and second ranges to be at least partially different. However, the first and second ranges could overlap. In an alternative embodiment, the first and second ranges of the input voltage signals are adjacent to each other. This embodiment would entail the advantage that an input voltage signal can be linearly amplified with as few components as possible. Alternatively, an overlapping of the ranges could have the advantage that the redundancy allows or simplifies error detection and compensation.

The voltage amplifier is preferably configured to amplify the first output signal by a prescribed first amplification factor with respect to the first range of the input voltage signal and to amplify the second output signal by a prescribed second amplification factor with respect to the second range of the input voltage signal. The first and second amplification factors can be selected so as to be the same or else different.

The voltage amplifier has a control stage, at least one input reference resistor arrangement and an amplifier circuit. The voltage amplifier can have two, three or more control stages. The control stage(s) is/are configured to transform the input voltage signal into one or more input current signals. The input reference resistor arrangement is configured to use the input current signal(s) in order to provide at least a first image of the first range of the input voltage signal and a second image of the second range of the input voltage signal, so that the first image encompasses the first operating point relative to the input voltage signal, and the second image encompasses the second operating point relative to the input voltage signal. The amplifier circuit is also configured to transform the first image into the first output signal and the second image into the second output signal.

In another embodiment, the amplifier circuit is configured to transform the first image into a first output current and the second image into a second output current. In this case, the amplifier circuit is preferably also configured so that, via a first output reference resistor, it emits the first output signal as a voltage drop of the first output current and so that, via a second output reference resistor, it emits the second output signal as the voltage drop of the second output current. The first output reference resistor and the second output reference resistor can be identical or else different. The output reference resistor(s) can also be variable, which could enhance the flexibility of the circuit arrangement.

The amplifier circuit is preferably configured to amplify the first output current by a defined first current amplification factor with respect to the input current signal and to amplify the second output current by a defined second current amplification factor with respect to the input current signal. A preferred embodiment could encompass, for example, one or more current mirrors with defined mirror ratios. The first current amplification factor could be the same as or else different from the second current amplification factor.

In an alternative embodiment, the amplifier circuit could have at least a first amplifier and a second amplifier. In this context, the first amplifier is preferably configured to transform the first image into the first output signal by means of a first negative feedback. In this context, the second amplifier is preferably configured to transform the second image into the second output signal by means of a second negative feedback. The amplifier circuit could also have 3, 4, 5 or more amplifiers with an associated negative feedback. The negative feedback of the individual amplifiers can be selected so as to be the same or else different. The amplifiers can be, for instance, operational amplifiers.

In a preferred embodiment, the first negative feedback is equal to the second negative feedback (and also of the same magnitude as every additional negative feedback in the case of more than two amplifiers). The voltage amplifier here is preferably configured to amplify the first output signal by the first amplification factor using the first amplifier and to amplify the second output signal by the second amplification factor using the second amplifier. The first amplification factor can be the same as or else different from the second amplification factor. In a preferred embodiment, the voltage amplifier has 3, 4, 5 or more amplifiers which are configured as operational amplifiers and which, through appropriate resistor circuits, have the same amplification factor.

It is another objective of the present invention to put forward an analog-to-digital converter circuit arrangement. The analog-to-digital converter circuit arrangement comprises at least one voltage amplifier of the type described above and at least one analog-to-digital converter. The analog-to-digital converter is configured to convert at least the first output signal into a first digital signal and to convert at least the second output signal into a second digital signal. The conversion can be effectuated successively in the case of periodic output signals, so that only an analog-to-digital converter is necessary. In a preferred embodiment, the analog-to-digital converter circuit arrangement has 2, 3, 4 or more analog-to-digital converters so that different ranges of the input voltage signal can be simultaneously converted into a digital signal. Such an arrangement, especially in the case of non-periodic signals, could allow a continuous digitization of an input voltage signal.

The first digital signal preferably represents a first linearly transformed range of the input voltage signal when the first digital signal has a first value, whereby the first value is greater than a first minimum digital value and smaller than a first maximum digital value. The second digital signal preferably represents a second linearly transformed range of the input voltage signal when the second digital signal has a second value, whereby the second value is greater than a second minimum digital value and smaller than a second maximum digital value. Therefore, in the case of several analog-to-digital converters, as a rule, only one of the analog-to-digital converters has a value that is between the minimum and the maximum digital output values of the analog-to-digital converters. Such analog-to-digital converters, which convert an output signal whose voltage is too high or too low, emit either the minimum or the maximum digital output value.

Another objective of the present invention is to put forward an improved method for voltage amplification for a programmable voltage range. The method encompasses the following steps:

transforming an input voltage signal so that a first range of the input voltage signal is placed in a first defined relation to a first operating point of an amplifier circuit, whereby the input voltage signal is transformed into an input current signal and, by means of the input current signal, a first image of the first range of the input voltage signal is provided, so that the first image encompasses the first operating point relative to the input voltage signal;

transforming the input voltage signal so that a second range of the input voltage signal is placed in a second defined relation to a second operating point of the amplifier circuit, whereby, by means of the input current signal, a second image of the second range of the input voltage signal is provided, so that the second image encompasses the second operating point relative to the input voltage signal;

linearly transforming the first range by means of the first image into a first output signal; and linearly transforming the second range by means of the second image into a second output signal.

Another objective of the present invention is to put forward an improved method for digitizing the input voltage signal. The method encompasses not only the above-mentioned steps, but also the following additional steps:

digitizing the first output signal; and digitizing the second output signal.

The individual steps of the method do not necessarily have to be carried out in the sequence indicated above.

It is pointed out that the filter circuit according to claim 1, the analog-to-digital converter circuit arrangement according to claim 11 and the method according to claim 13 have similar and/or identical embodiments, especially as they are described in the dependent claims.

It is also pointed out that every combination of the dependent claims with the corresponding independent claims also constitutes a preferred embodiment of the invention.

Additional preferred embodiments are described below.

BRIEF DESCRIPTION OF THE FIGURES

These and other aspects of the invention are shown in detail in the figures as follows.

DETAILED DESCRIPTION OF THE EMBODIMENTS

Figure 1:
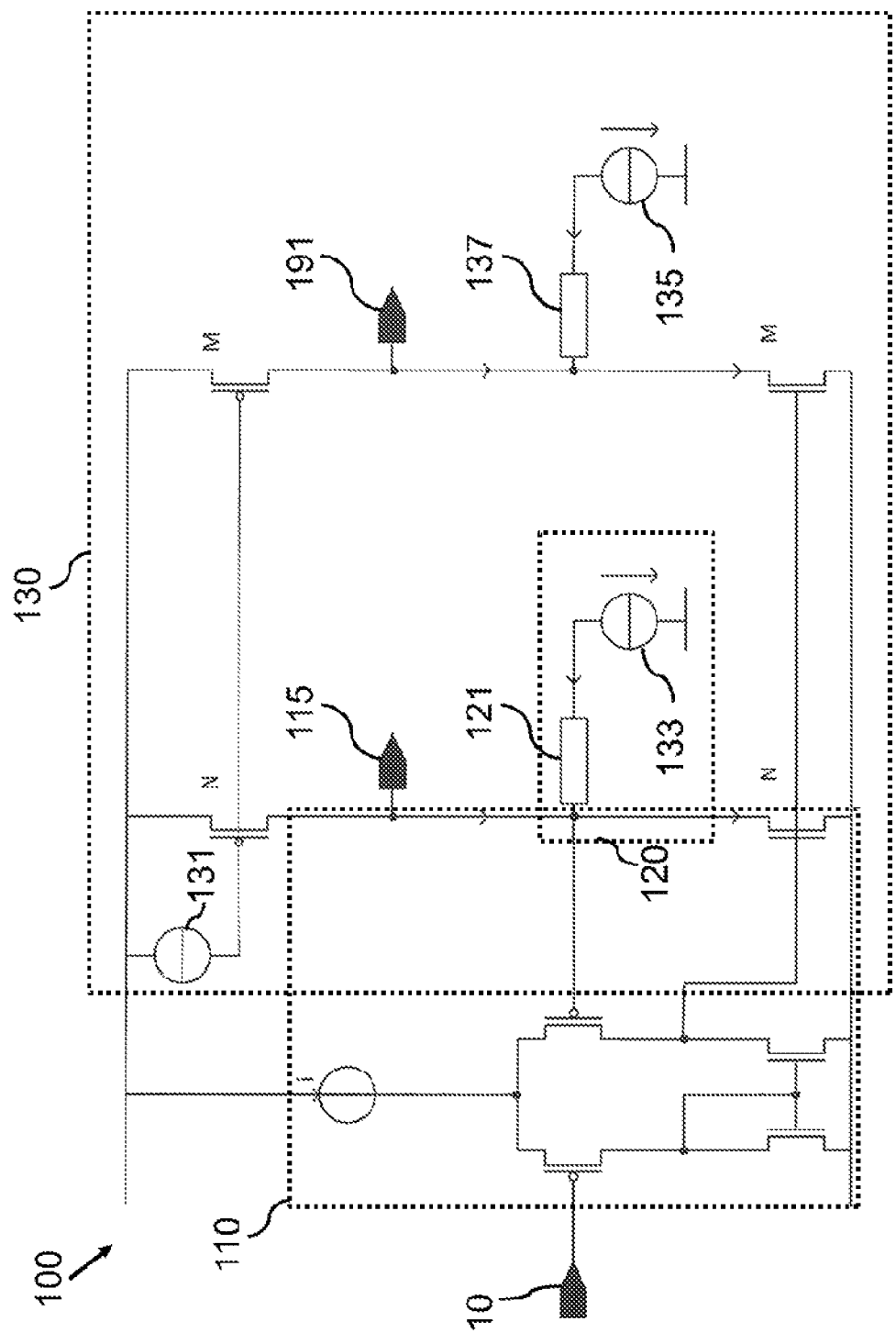
FIG. 1 shows a first voltage amplifier.

FIG. 1 shows a first voltage amplifier 100. The first voltage amplifier 100 comprises a control stage 110 having a power source and a differential amplifier that is made up of field-effect transistors. The input, and thus the input voltage signal 10, is conveyed to a gate of a self-locking first field-effect transistor of the differential amplifier, whereby the source of this field-effect transistor is connected to the power source. Here, the output of the differential amplifier is connected to a gate of a self-conducting field-effect transistor which, in turn, is connected to another gate of a second self-locking field-effect transistor of the differential transistor which is connected counter to the first self-locking field-effect transistor at the input. Owing to this connection, the input voltage 115 is present at the gate of the second self-locking field-effect transistor. The first voltage amplifier 100 also has an amplifier circuit 130 which, in this case, is configured as a current mirror. The first voltage amplifier 100 comprises an input reference resistor arrangement 120 having an input reference resistor 121 and an input reference voltage 133. The input reference voltage 133 is connected to the input reference resistor 121 which, in turn is connected to the gate of the second self-locking field-effect transistor. Therefore, the input voltage is also present at the output of the input reference resistor. Thus, the input voltage is:

$$V_{input} = R_{signal} * i_{signal} + V_{refinput}$$

wherein $R_{signal}$ stands for the input reference resistor 121 and $V_{refinput}$ stands for the input reference voltage 133. The current $i_{signal}$ stands for the current flowing through the input reference resistor 121. A bias voltage 131 is applied between the inputs of the two self-locking field-effect transistors of the current mirror of the amplifier circuit 130 and of the associated gate, whereby the current mirror has an M/N mirror ratio. Therefore, a current $i_{bias}$ flows through the self-locking field-effect transistor of the current mirror that is connected to the output of the input reference resistor 121 and to the gate of the second self-locking field-effect transistor of the differential amplifier. Consequently, a current $i_{bias} + i_{signal}$ flows through the self-conducting field-effect transistor of the amplifier circuit 130 whose gate is used for the feedback of the input voltage signal 10. Therefore, due to the mirror ratio, on the output side of the current mirror, a current $(M/N) * i_{bias}$ flows above a contact point with an output reference circuit comprising an output reference resistor 137 and an output reference voltage 135, and a current $(M/N) * i_{bias} + i_{signal}$ flows below the contact point. Therefore, a current $(M/N) * i_{signal}$ flows via the output reference resistor 137. Thus, in the case of the first voltage amplifier 100, a first output signal 191 is:

$$V_{output} = R_{output} * (M/N) * i_{signal} + V_{refoutput}$$

wherein $R_{output}$ stands for the output reference resistor 137 and $V_{refoutput}$ stands for the output reference voltage 135. Therefore, the operating point of the first voltage amplifier 100 can be set essentially freely in relation to the one input reference signal 10 by means of the input reference resistor 121, the input reference voltage 133, the output reference resistor 137 and the output reference voltage 135.

In this manner, all kinds of input voltage signals 10 can be adapted in such a way that they can be linearly amplified by means of the amplifier circuit 130. In order to ensure this setting capability the reference resistors as well as the reference voltages can be configured, for instance, so that they can be set. The concrete values for the reference resistances as well as the reference voltages depend on the application, on the technology and on the overall concept. In this context, when the voltage amplifier 100 is employed in an analog-to-digital converter circuit arrangement 500, the number of desired bits, for example, is likewise significant.

Figure 2:
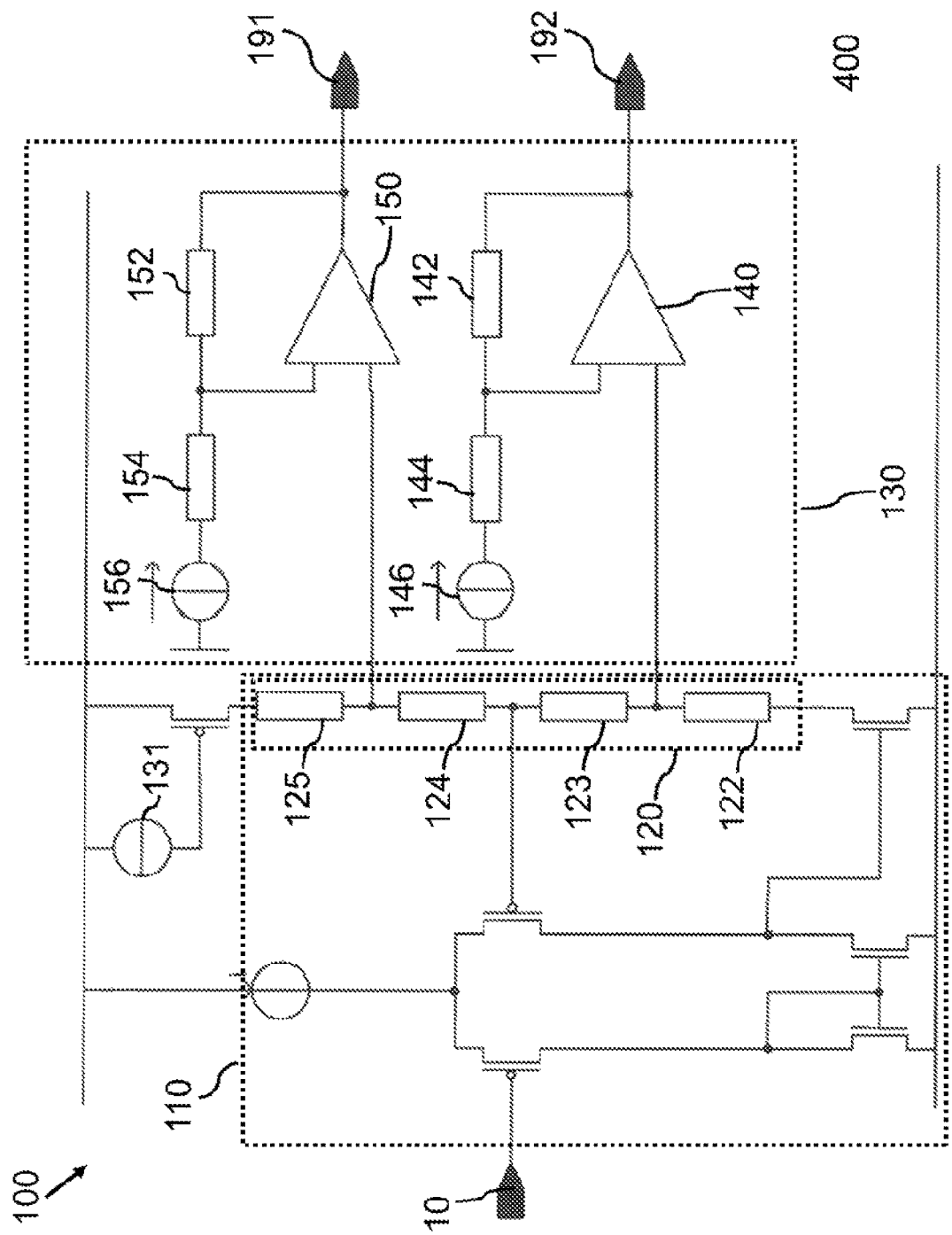
FIG. 2 shows a second voltage amplifier.

FIG. 2 shows a second voltage amplifier 100. The second voltage amplifier 100 again comprises a control stage 110 having a power source and a differential amplifier, whereby the output signal is analogously fed back to the differential amplifier as explained in conjunction with FIG. 1. Analogously to the situation in FIG. 1, a bias current is made available by means of a bias voltage 131, whereby this bias current flows via the input reference resistors 122, 123, 124 and 125 of the input reference resistor arrangement 120. The input reference resistors 122, 123, 124 and 125 are then selected in such a way that potentials defined between the input reference resistors 122, 123, 124 and 125 can each be set in such a way that various operating points of an amplifier circuit 130 can be set in relation to the input voltage signal 10. In this context, the amplifier circuit 130 has a first amplifier 140 whose positive input is connected to the reference resistor arrangement 120, whereby, at the positive input of the first amplifier 140, the potential is present between the first input reference resistor 122 and the second input reference resistor 123. The output of the first amplifier 140 is negatively fed back to a first negative feedback resistor 142. Moreover, the negative output of the first amplifier 140 is connected to a first amplifier bias voltage 146 via a first amplifier resistor 144. The amplification of the first amplifier 140 is set by means of the first negative feedback resistor 142 and by means of the first amplifier resistor 144, and it can also encompass the value of 1. The gate of the self-locking field-effect transistor in the input of the differential resistor—which is connected counter to the self-locking field-effect transistor that picks up the input voltage signal 10 as the control signal—is connected between the second input reference resistor 123 and the third input reference resistor 124. The input voltage is present at this point, as elaborated upon in conjunction with FIG. 1. A positive input of a second amplifier 150, which is likewise encompassed by the amplifier circuit 130, is connected between the third input reference resistor 124 and the fourth input reference resistor 125. The output of the second amplifier 150 is negatively fed back to a second negative feedback resistor 152. The negative output of the second resistor 150 is also connected to a second amplifier bias voltage 156 via a second amplifier resistor 154. The amplification of the second amplifier 150 is set by means of the second negative feedback resistor 152 and by means of the second amplifier resistor 154. In the concrete embodiment shown in FIG. 2, the individual components have the following values: the first input reference resistor 122 has the value R2, the second input reference resistor 123 has the value R2/2, the third input reference resistor 124 has the value R2/2, the fourth input reference resistor 125 has the value R2, the first and the second amplifier resistors 144, 154 each have the value R1, the first and the second negative feedback resistors 142, 152 each have the value 2*R1, the first and the second amplifier bias voltages 146, 156 are the same and have a different value from that of the bias voltage 131 (examples of values for the individual quantities: R1=500 ohm (is set primarily by the bandwidth of the signal), R2=200 ohm (at a current of 1 mA through the output stage of the control unit, the result is voltage segments of 200 mV each, so that the output voltage at a ratio of 2 for the values of the resistors 142 and 144 are each 200 mV around the amplifier bias voltage), amplifier bias voltage=half of the supply voltage range, it depends especially on the following comparators, bias voltage=for example, 300 mV, it should be within the expected input voltage range, in order to fully utilize the amplifier range). The potentials at the positive inputs of the first and second amplifiers in relation to the other voltage signal 10 can thus be set by means of the input reference resistors 122, 123, 124 and 125. If the first and second amplifiers 140, 150 thus have the same absolute operating point, then different operating points in relation to the input voltage signal 10 can be set by means of the input reference resistors 122, 123, 124 and 125.

Figure 3:
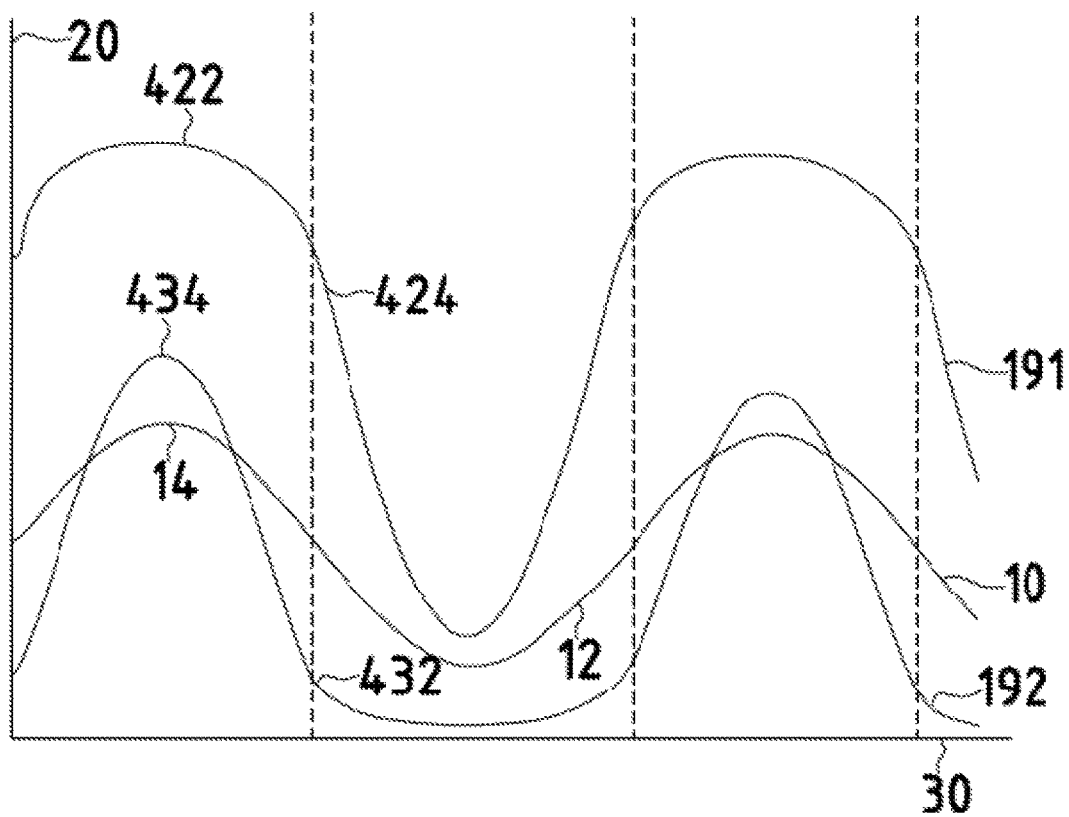
FIG. 3 shows a signal curve for the second voltage amplifier.

FIG. 3 shows a signal curve for the second voltage amplifier 100. The signal amplitude 20 of the input voltage signal 10 is plotted here over the time 30. The input voltage signal is divided by a vertical broken line into a first range 12 and a second range 14. In this case, the input voltage signal 10 is sinusoidal and the second range corresponds to the positive half-wave, and the first range corresponds to the negative half-wave. In the second range 14 of the input voltage signal 10, the second output signal 192 has a linear part 434. In this second area of the input voltage signal 10, the second amplifier 150 has a linear amplification. This linear amplification is due to the fact that the voltage at the positive input of the second amplifier 150 is reduced in relation to the input voltage by the value $R2/2^{*i}_{bias}$. In the first range 12 of the input voltage signal 10, the second amplifier 150 overdrives and emits a non-linear signal 432. In the first range 12 of the input voltage signal 10, the first output signal 191 has a linear part 424. In this first range of the input voltage signal 10, the first amplifier 140 has a linear amplification. This linear amplification is due to the fact that the voltage at the positive input of the first amplifier 140 is reduced in relation to the input voltage by the value $R2/2^{*i}_{bias}$. In the second range 14 of the input voltage signal 10, the first amplifier 140 overdrives and emits a non-linear signal 422.

Figure 4:
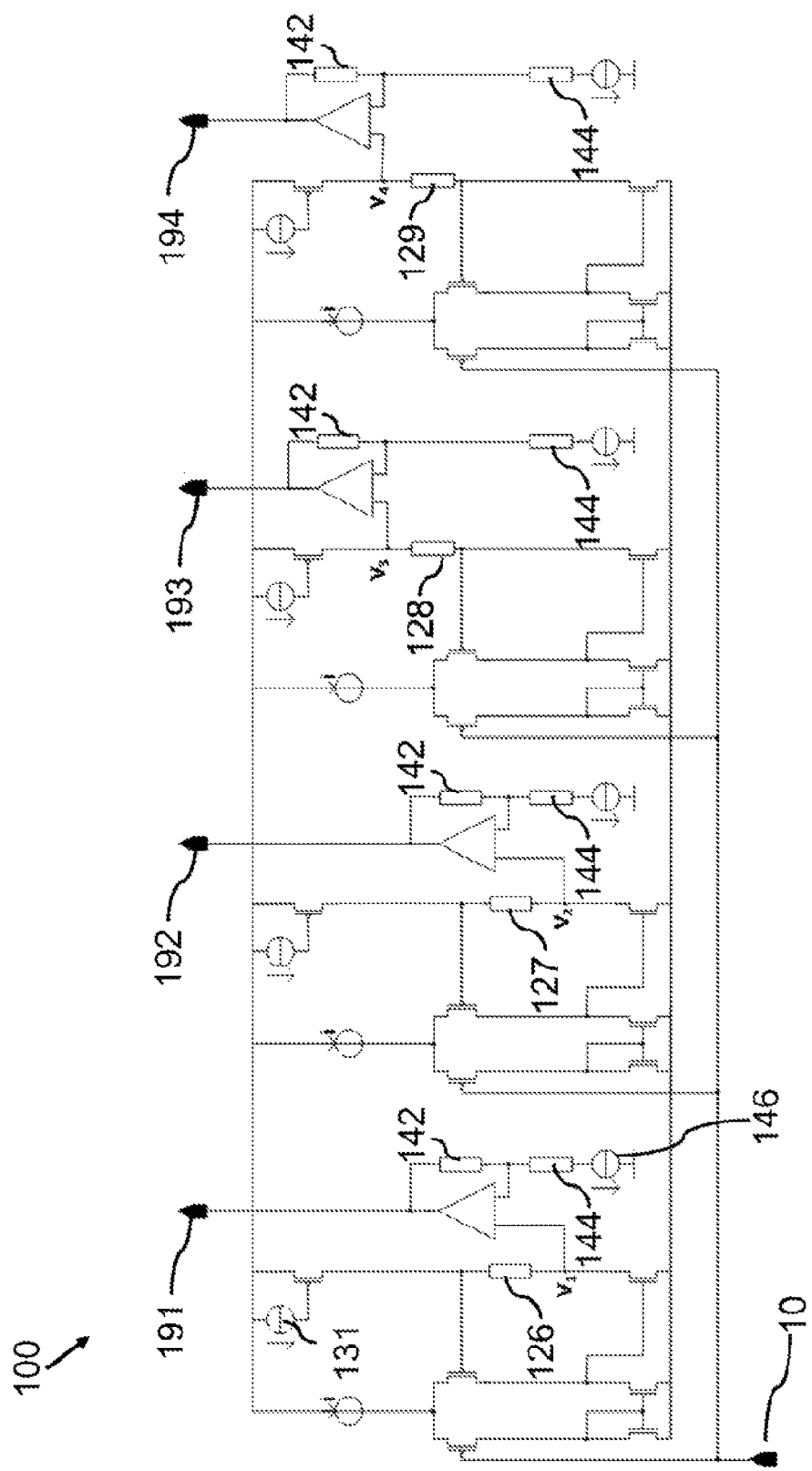
FIG. 4 shows a third voltage amplifier.

FIG. 4 shows a third voltage amplifier 100 having four outputs. The circuit diagram of the voltage amplifier 100 is very similar to that of FIG. 2. Unlike in FIG. 2, however, one control stage 110 per output is made available at the input. Once again, the operating points of the four amplifiers arranged in parallel are defined in relation to the input voltage signal 10 by means of the input reference resistor arrangement, which has four input reference resistors 126, 127, 128 and 129. In this process, the potential (V1, V2, V3, V4) present at the positive inputs of the amplifiers is determined by the position of the contact points relative to the input reference resistors 126, 127, 128 and 129 in the current path of the appertaining bias currents (selected so as to be of the same magnitude) and relative to the magnitude of the input reference resistors 126, 127, 128 and 129. In the concrete embodiment shown in FIG. 2, the individual components have the following values: the fifth input reference resistor 126 has the value 1.5*R2, the sixth input reference resistor 127 has the value R2/2, the seventh input reference resistor 128 has the value R2/2, the fourth input reference resistor 129 has the value 1.5*R2, the amplifier resistors 144 each have the value R1, the negative feedback resistors 142 each have the value n*R1, the first amplifier bias voltage 146 is the same for all of the amplifiers and has a different value from that of the bias voltage 131.

Figure 5:
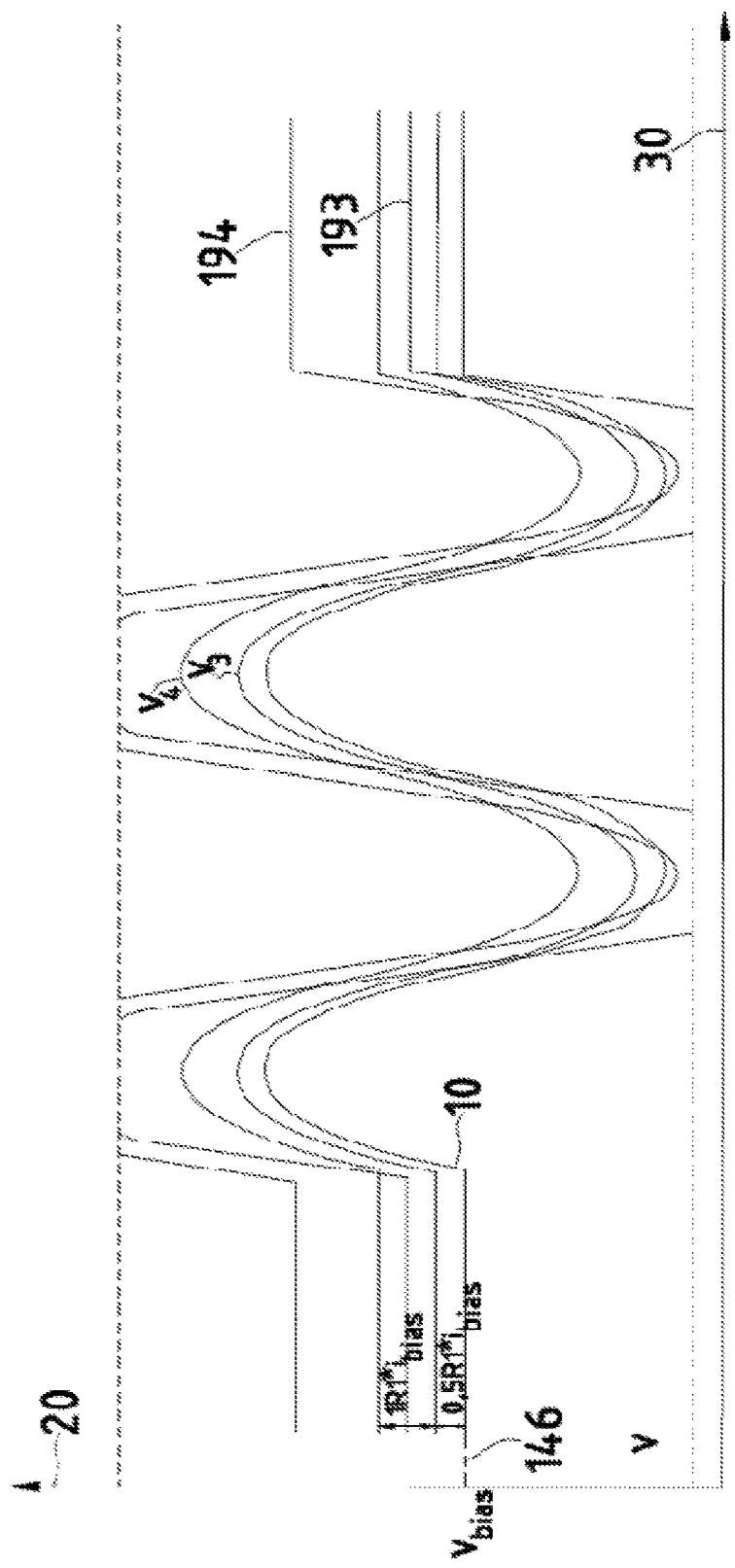
FIG. 5 shows a signal curve for the third voltage amplifier.

FIG. 5 shows a signal curve for the third voltage amplifier 100 as it is described in FIG. 4. The input voltage signal 10, the voltage V3 at the positive input of the third amplifier, the voltage V4 at the positive input of the fourth amplifier, the third output signal 193 and the fourth output signal 194 are shown. The voltages V3 and V4 are shifted by the input reference resistors 128 and 129 vis-à-vis the input voltage signal 10. Consequently, different operating points of the amplifiers in relation to the input voltage signal 10 are defined by means of the input reference resistors 128 and 129. The consequence of the shift becomes apparent in the third and fourth output signals 193 and 194, where it can be seen that the input voltage signal 10 is linearly amplified by the appertaining amplifier only in certain ranges. As a result, it is possible to divide an input voltage signal 10 into several amplitude ranges (for instance, −10V to −5V, −5V to 0V, 0V to 5V, 5V to 10V) and then to linearly amplify these amplitude ranges separately from each other using the individual amplifiers. Here, the two horizontally broken boundary lines indicate the ground potential in relation to the supply voltage at the lower edge and to the supply voltage at the upper edge.

Figure 6:
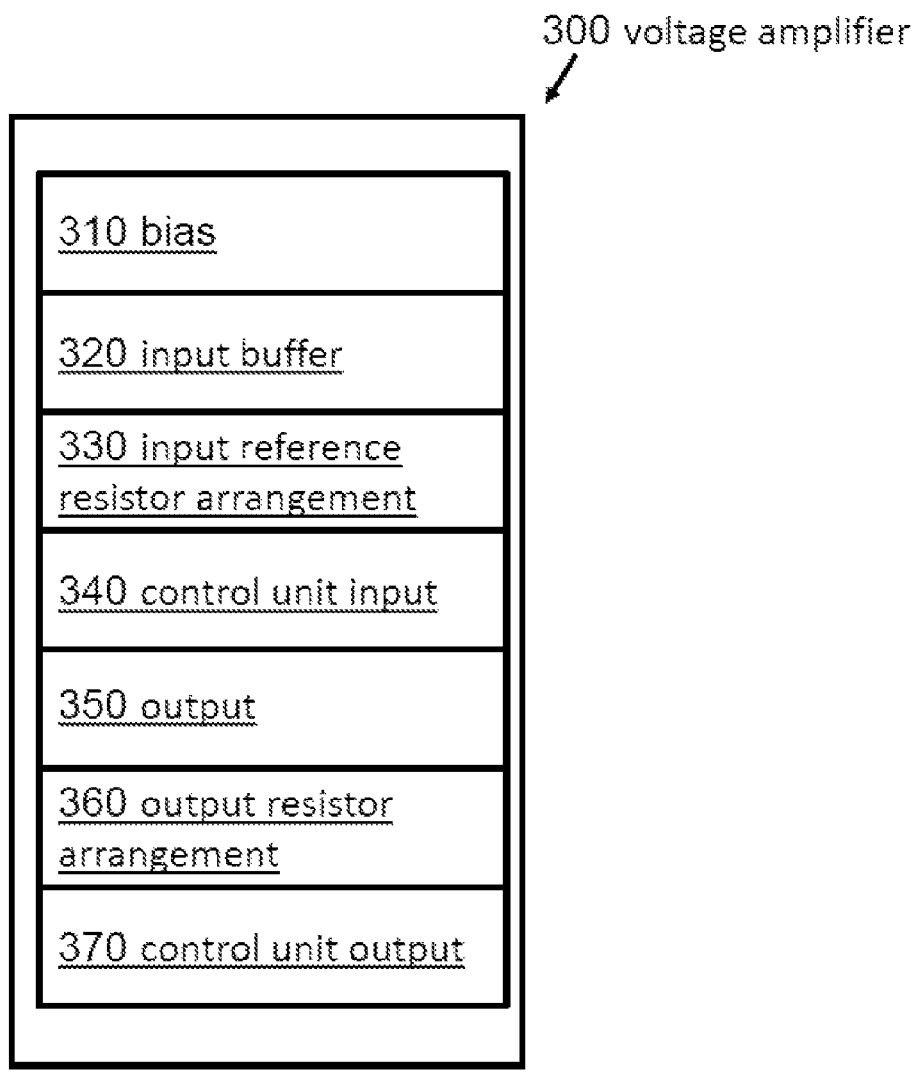
FIG. 6 shows a schematic drawing of a fourth voltage amplifier.

FIG. 6 shows a schematic drawing of a fourth voltage amplifier 300. As can be seen from the elaborations pertaining to FIGS. 1 to 3, the voltage amplifier 300 according to the invention can be realized by a wide array of concrete circuit arrangements. A schematic depiction of the fourth voltage amplifier given by way of example comprises a bias 310, an input buffer 320, an input reference resistor arrangement 330, a control unit of the input 340, an output 350, an output resistor arrangement 360 and a control unit of the output 370. The circuit diagram of the fourth voltage amplifier 300 schematically shown in FIG. 6 can be implemented in the form of integrated circuits as well as in the form of conventional circuit technology.

Figure 7:
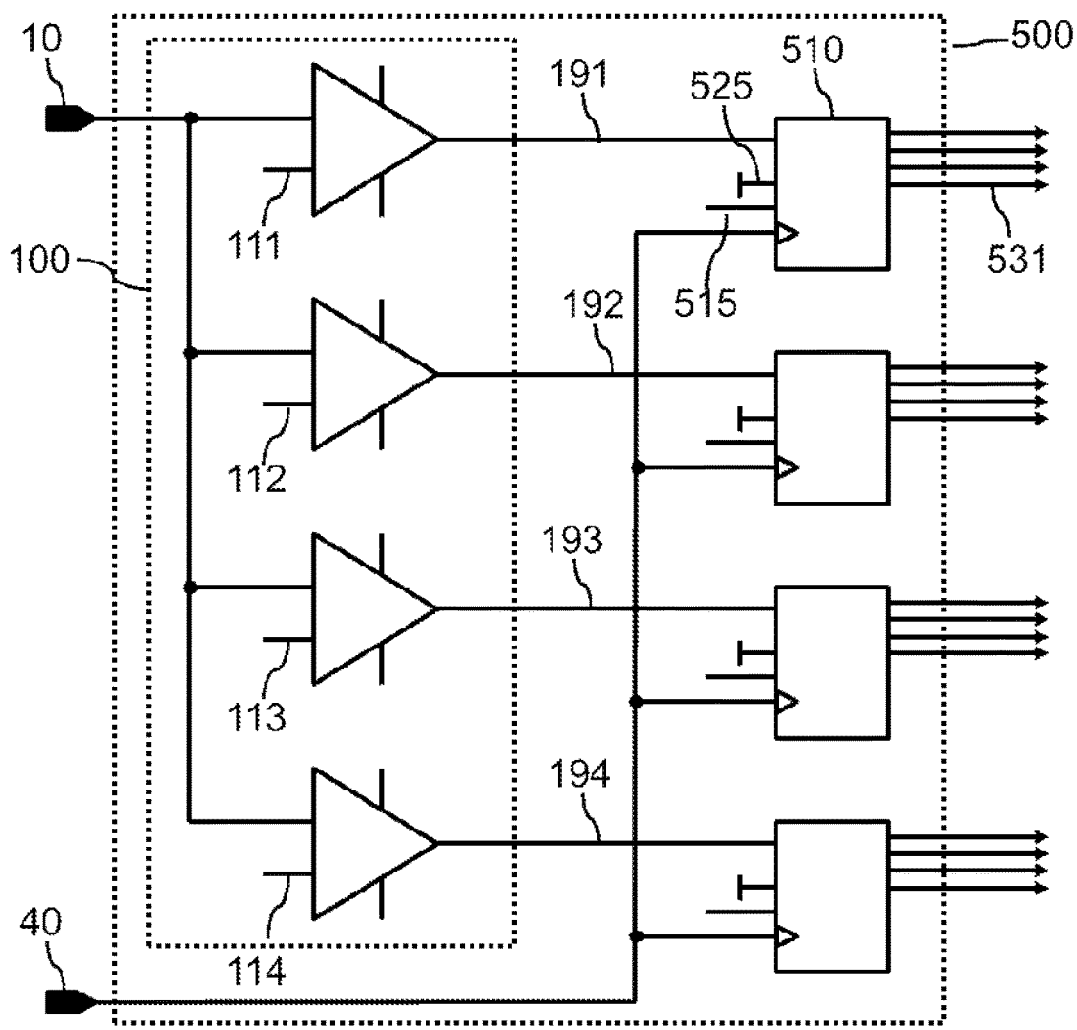
FIG. 7 shows an analog-to-digital converter with the third voltage amplifier.

FIG. 7 shows an analog-to-digital converter circuit arrangement with the third voltage amplifier 100. Each of the four amplification branches having the different input reference voltages 111, 112, 113 and 114 has one of the amplifiers shown in FIG. 4, which emits the output signals 191, 192, 193 and 194. Each of these output signals 191, 192, 193 and 194 is relayed to an unambiguously associated analog-to-digital converter 510. Each of these analog-to-digital converters 510 is connected to the ground 525 and to a reference voltage 515, which is uniform in this case. The analog-to-digital converters 510 now emit digital signals 531. The output signals 191, 192, 193 and 194 as well as the reference voltage 515 are selected in such a way that only one of the four analog-to-digital converters 510 emits a digital value that is between a minimum and a maximum digital value. The three other analog-to-digital converters 510 receive output signals 191, 192, 193 and 194 whose voltage is too high or too low. Thus, these three analog-to-digital converters 510 emit either the minimum digital value (for instance, 0000) or else the maximum digital value (for instance, 1111). Therefore, the linearly amplified range of the input voltage signal 10 can be determined in a simple manner through a comparison of the digital signals 531 at the outputs of the analog-to-digital converters 510. In this process, the digital signals 531 are emitted in time-discrete steps that are determined by a clock 40. In the case where the output signals are precisely at the boundary between two ranges of the input voltage signal 10, the analog-to-digital converter(s) 510 emit(s) the correct value at which the maximum digital value changes over to the minimum digital value or vice versa.

Figure 8:
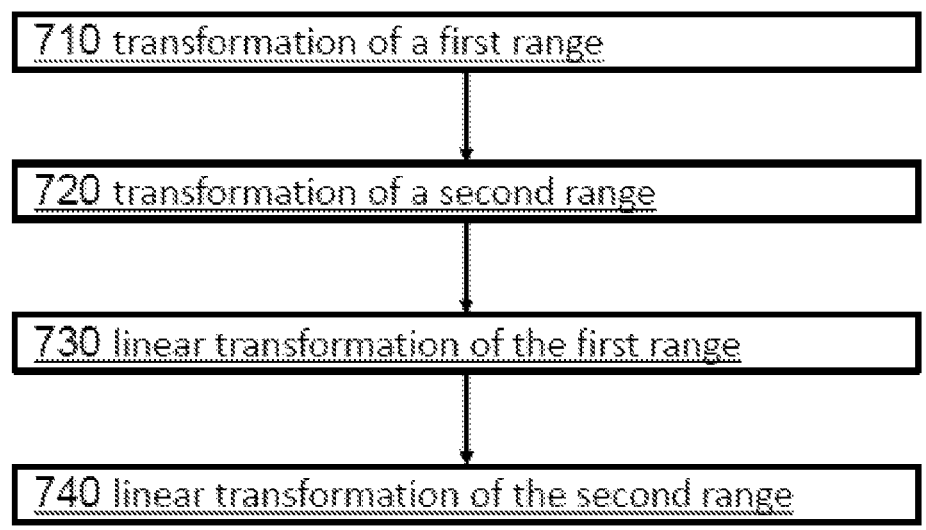
FIG. 8 shows a schematic drawing of a method for voltage amplification.

FIG. 8 shows a schematic drawing of a method for voltage amplification. In step 710, an input voltage signal 10 is transformed in such a way that a first range 12 of the input voltage signal 10 is placed in a first defined relation to a first operating point of an amplifier circuit. In step 720, an input voltage signal 10 is transformed in such a way that a second range 14 of the input voltage signal 10 is placed in a second defined relation to a second operating point of the amplifier circuit. In step 730, the first range 12 is transformed linearly into a first output signal 191. In step 740, the second range 14 is transformed linearly into a second output signal 192.

It is an idea of the present invention to place defined ranges 12, 14 of an input voltage signal 10 in different relations in terms of the input voltage signal at one or more operating points of an amplifier circuit 130. An appropriate division of the ranges 12, 14 of the input voltage signal 10 makes it possible to linearly amplify the appertaining ranges 12, 14. Such linearly amplified output signals can then be converted into digital signals, for example, by means of several analog-to-digital converters 510. In this manner, it is possible to use relatively simple analog-to-digital converters 510 in order to obtain a high-resolution digital signal 531. There is no need for a laborious calibration of the type that has to be carried out, for example, in the case of pipeline ADCs.

Other variants of the invention and their execution can be gleaned by the person skilled in the art from the preceding disclosure, the figures and the patent claims.

Terms used in the patent claims such as "encompass", "comprise", "contain", "have" and the like do not exclude additional elements or steps. The use of the indefinite article does not preclude the plural. Each individual device can execute the functions of several of the units or devices cited in the patent claims. The reference numerals indicated in the patent claims are not to be construed as a limitation of the means and steps employed.

LIST OF REFERENCE NUMERALS 10 input voltage signal
12 first range
14 second range
20 signal amplitude
30 time axes
40 clock
100, 300 voltage amplifier
110 control stage
111 first input reference voltage
112 second input reference voltage
113 third input reference voltage
114 fourth input reference voltage
115 input voltage
120, 330 input reference resistor arrangement
121 input reference resistor
122 first input reference resistor
123 second input reference resistor
124 third input reference resistor
125 fourth input reference resistor
126 fifth input reference resistor
127 sixth input reference resistor
128 seventh input reference resistor
129 eighth input reference resistor
130 amplifier circuit
131 bias voltage
133 input reference voltage
135 output reference voltage
137 output reference resistor
140 first amplifier
142 first negative feedback resistor
144 first amplifier resistor
146 first amplifier bias voltage
150 second amplifier
152 second negative feedback resistor
154 second amplifier resistor
156 second amplifier bias voltage
191 first output signal
192 second output signal
193 third output signal
194 fourth output signal
310 bias
320 input buffer
340 control unit input
350 output
360 output resistor arrangement
370 control unit output
422 non-linear part of the first output signal
424 linear part of the first output signal
432 non-linear part of the second output signal
434 linear part of the second output signal
500 analog-to-digital converter circuit arrangement
510 analog-to-digital converter
515 reference voltage
525 ground
531 digital signal
710 transformation of a first range
720 transformation of a second range
730 linear transformation of the first range
740 linear transformation of the second range

The invention claimed is:

1. A voltage amplifier for a programmable voltage range, whereby the voltage amplifier has at least a first and a second operating point relative to an input voltage signal, and whereby the voltage amplifier is configured to linearly transform a first range of the input voltage signal into a first output signal by means of the first operating point, and whereby the voltage amplifier is also configured to linearly transform a second range of the input voltage signal into a second output signal by means of the second operating point, whereby the voltage amplifier has a control stage, at least one input reference resistor arrangement and an amplifier circuit, whereby the control stage is configured to transform the input voltage signal into an input current signal, the input reference resistor arrangement is configured to use the input current signal in order to provide a first image of the first range of the input voltage signal and a second image of the second range of the input voltage signal, so that the first image encompasses the first operating point relative to the input voltage signal, and the second image encompasses the second operating point relative to the input voltage signal, and whereby the amplifier circuit is configured to transform the first image into the first output signal and the second image into the second output signal.

2. The voltage amplifier according to claim 1, whereby the voltage amplifier has a variable operating point so that, aside from the first and second operating points, additional operating points can be set relative to the input voltage signal.

3. The voltage amplifier according to claim 1, whereby the voltage amplifier is configured to simultaneously provide the first and second operating points.

4. The voltage amplifier according to claim 3, whereby the first and second operating points are set in such a way that the first range of the input voltage signal and the second range of the input voltage signal have at least one shared value.

5. The voltage amplifier according to claim 4, whereby the first range of the input voltage signal and the second range of the input voltage signal are adjacent to each other.

6. The voltage amplifier according to claim 1, whereby the voltage amplifier is configured to amplify the first output signal by a prescribed first amplification factor with respect to the first range of the input voltage signal, and whereby the voltage amplifier is configured to amplify the second output signal by a prescribed second amplification factor with respect to the second range of the input voltage signal.

7. The voltage amplifier according to claim 6, whereby the amplifier circuit is configured to transform the first image into a first output current and the second image into a second output current, and whereby the amplifier circuit is also configured so that, via a first output reference resistor, it emits the first output signal as a voltage drop of the first output current and so that, via a second output reference resistor, it emits the second output signal as a voltage drop of the second output current.

8. The voltage amplifier according to claim 7, whereby the amplifier circuit is configured to amplify the first output current by a defined first current amplification factor with respect to the input current signal and to amplify the second output current by a defined second current amplification factor with respect to the input current signal.

9. The voltage amplifier according to claim 1, whereby the amplifier circuit has at least a first amplifier and a second amplifier, whereby the first amplifier is configured to transform the first image into the first output signal by means of a first negative feedback, and whereby the second amplifier is configured to transform the second image into the second output signal by means of a second negative feedback.

10. The voltage amplifier according to claim 9, whereby the first negative feedback is equal to the second negative feedback, whereby the voltage amplifier is configured to amplify the first output signal by the first amplification factor using the first amplifier, and whereby the voltage amplifier is also configured to amplify the second output signal by the second amplification factor using the second amplifier, and the first amplification factor is the same as the second amplification factor.

11. An analog-to-digital converter circuit arrangement comprising at least one voltage amplifier according to claim 1 and at least one analog-to-digital converter, whereby the analog-to-digital converter is configured to convert at least the first output signal into a first digital signal and to convert at least the second output signal into a second digital signal.

12. The analog-to-digital converter circuit arrangement according to claim 11, whereby the first digital signal represents a first linearly transformed range of the input voltage signal when the first digital signal has a first value, whereby the first value is greater than a first minimum digital value and smaller than a first maximum digital value, and whereby the second digital signal represents a second linearly transformed range of the input voltage signal when the second digital signal has a second value, whereby the second value is greater than a second minimum digital value and smaller than a second maximum digital value.

13. A method for voltage amplification for a programmable voltage range, encompassing the following steps:
transforming an input voltage signal so that a first range of the input voltage signal is placed in a first defined relation to a first operating point of an amplifier circuit, whereby the input voltage signal is transformed into an input current signal and, by means of the input current signal, a first image of the first range of the input voltage signal is provided, so that the first image encompasses the first operating point relative to the input voltage signal;
transforming the input voltage signal so that a second range of the input voltage signal is placed in a second defined relation to a second operating point of the amplifier circuit, whereby, by means of the input current signal, a second image of the second range of the input voltage signal is provided, so that the second image encompasses the second operating point relative to the input voltage signal (10);
linearly transforming the first range by means of the first image into a first output signal; and
linearly transforming the second range by means of the second image into a second output signal.

14. A method for digitizing the input voltage signal, encompassing the steps according to claim 13, and also encompassing the following steps:
digitizing the first output signal; and
digitizing the second output signal.

* * * * *